US009252738B1

(12) United States Patent
Tsironis

(10) Patent No.: US 9,252,738 B1
(45) Date of Patent: Feb. 2, 2016

(54) WIDEBAND TUNING PROBES FOR IMPEDANCE TUNERS AND METHOD

(71) Applicant: Christos Tsironis, Kirkland, CA (US)

(72) Inventor: Christos Tsironis, Kirkland, CA (US)

(*) Notice: Subject to any disclaimer, the term of this patent is extended or adjusted under 35 U.S.C. 154(b) by 216 days.

(21) Appl. No.: 14/133,746

(22) Filed: Dec. 19, 2013

Related U.S. Application Data

(60) Provisional application No. 61/749,575, filed on Jan. 7, 2013.

(51) Int. Cl.
*H03H 7/38* (2006.01)
*H03H 7/40* (2006.01)

(52) U.S. Cl.
CPC .. *H03H 7/38* (2013.01); *H03H 7/40* (2013.01)

(58) Field of Classification Search
CPC .................................. H03H 7/38; H03H 7/40
USPC .................... 333/32, 33, 17.3, 263
See application file for complete search history.

(56) References Cited

U.S. PATENT DOCUMENTS

| 6,674,293 | B1 | 1/2004 | Tsironis | |
|---|---|---|---|---|
| 6,850,076 | B2 | 2/2005 | Tsironis | |
| 6,980,064 | B1 | 12/2005 | Boulerne | |
| 7,042,233 | B1* | 5/2006 | Boulerne | G01R 31/2822 324/642 |
| 7,053,628 | B1 | 5/2006 | Tsironis | |
| 2006/0022776 | A1* | 2/2006 | Boulerne | H01P 1/212 333/263 |
| 2007/0171008 | A1* | 7/2007 | Boulerne | G01R 1/26 333/263 |
| 2012/0176145 | A1* | 7/2012 | Simpson | H01P 1/127 324/642 |

OTHER PUBLICATIONS

Lte Commumication from Wikipedia, pp. 1 to 5, Dec. 11, 2013.
Product Note 52, "Prematching tuners for very high VSWR and power load pull measurements"; Focus Microwaves, Feb. 1999.
"Three probe tuners tackles multiple tasks", Microwaves & RF Magazine, Feb. 2005, pp. 90ff.

* cited by examiner

*Primary Examiner* — Stephen E Jones

(57) ABSTRACT

Multi-segment RF probes for automatic slide screw impedance tuners include a multitude of slugs, which are individually adjustable towards the center conductor of the slabline and spaced against each-other in order to create the required capacitance and transmission line space values needed for synthesizing resonant networks to match arbitrary reflection factor patterns over a given frequency range. The multi-segment probes are optimized using network synthesis software within the limits of the capacitance and inductance values allowed by the hardware. The probes allow constant phase testing for 100 MHz bandwidths or more.

10 Claims, 20 Drawing Sheets

Multi-section probe with adjustable coupling and phase per section

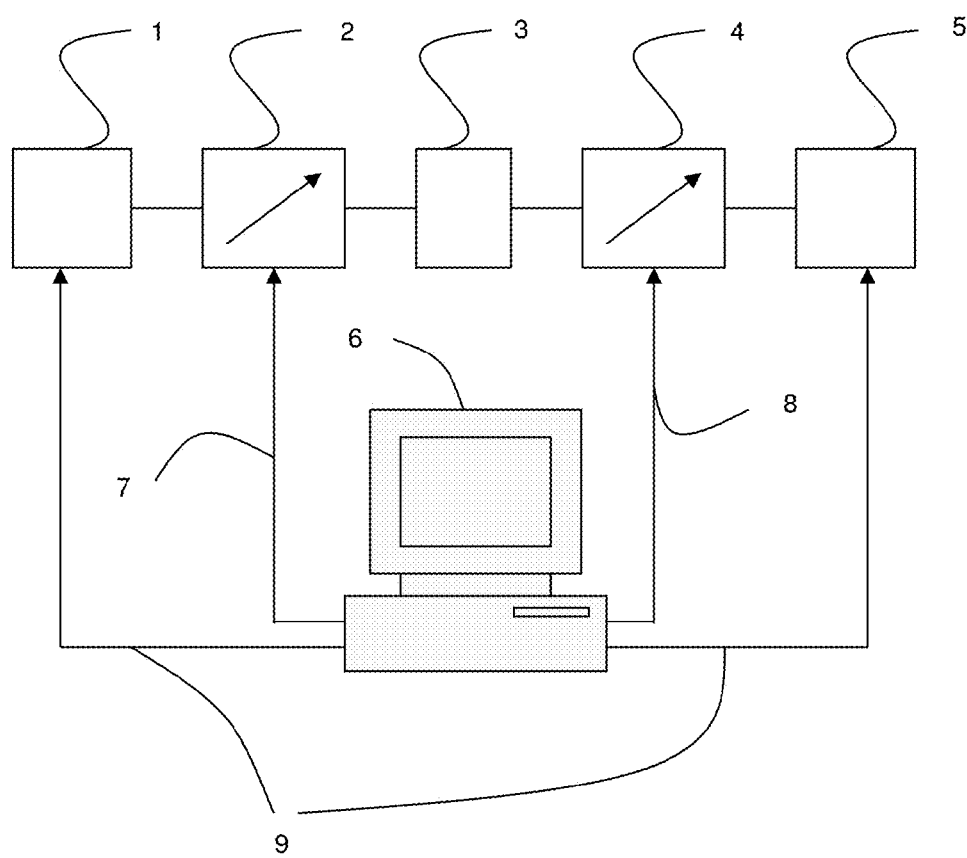
FIGURE 1: Prior art, typical automated load pull test setup

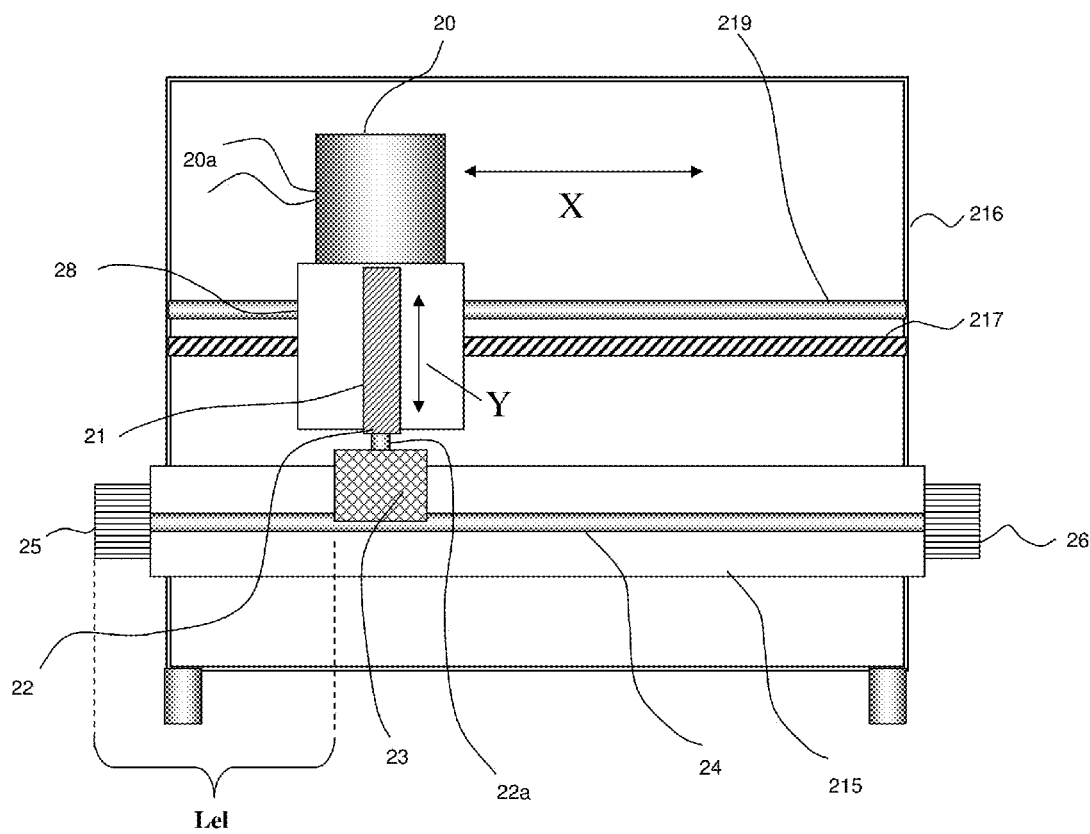
FIGURE 2: Prior art, front view of slide screw tuner with a single vertical axis and probe

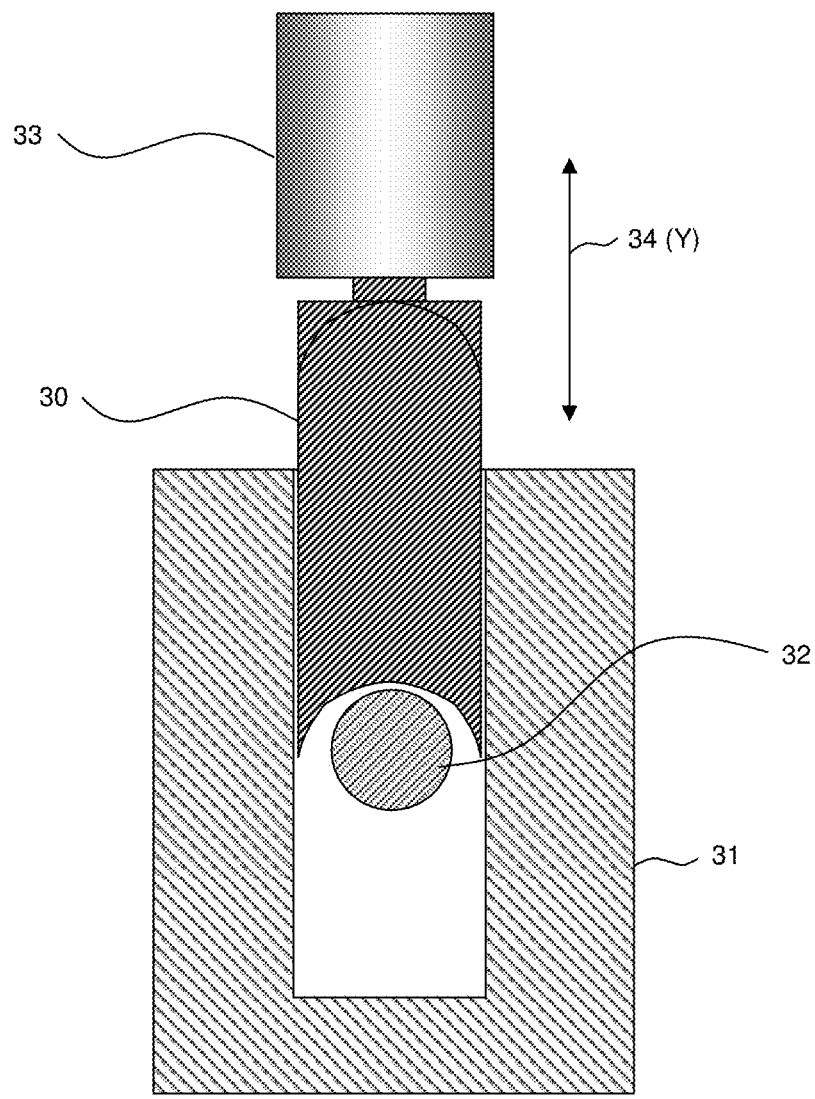
FIGURE 3: Prior art, cross section of RF probe and slotted airline (slabline) of slide screw tuner

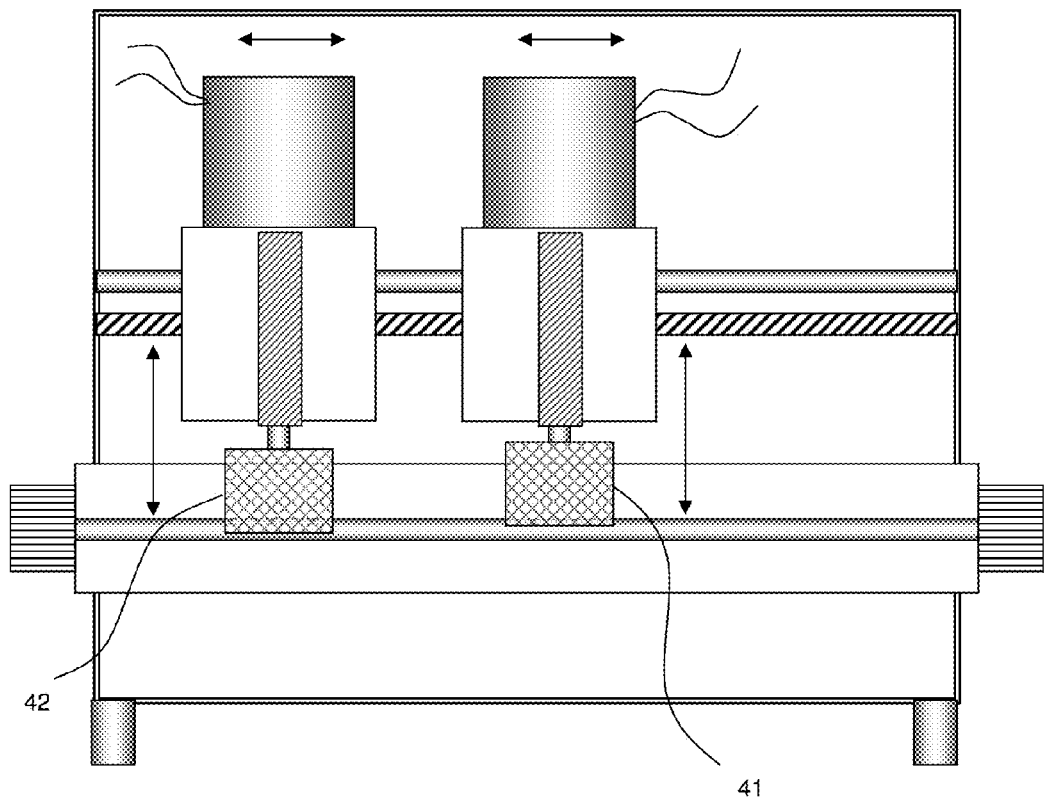
FIGURE 4: Prior art, front view of slide screw tuner with two independent probes and vertical axes

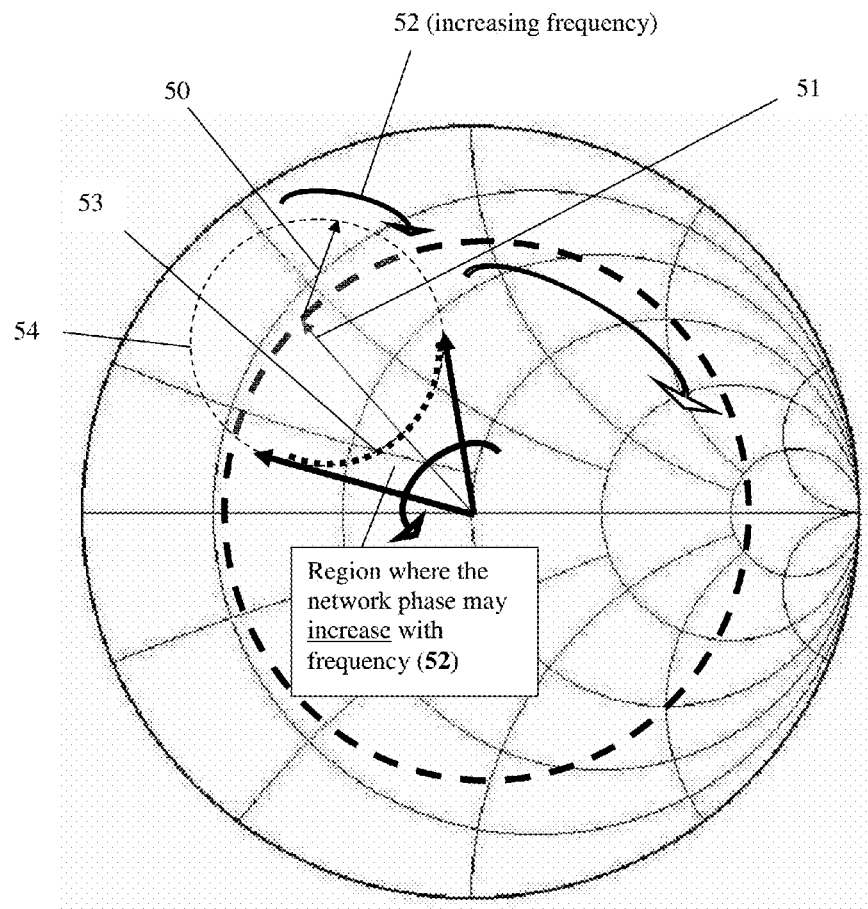
FIGURE 5: Prior art: tuning with two independent probes; first probe creates vector (51), second probe creates (52). Parameter is frequency, probes are fixed.

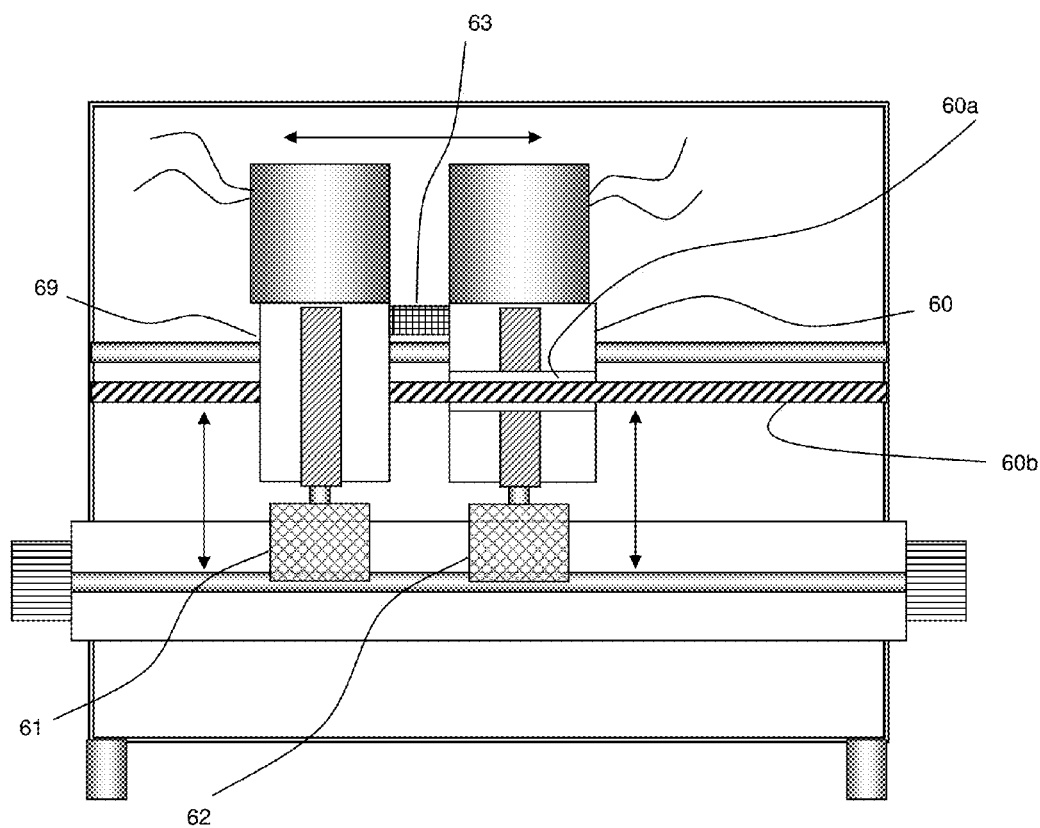
FIGURE 6: Prior art, front view of slide screw tuner with two linked and synchronous vertical axes and probes

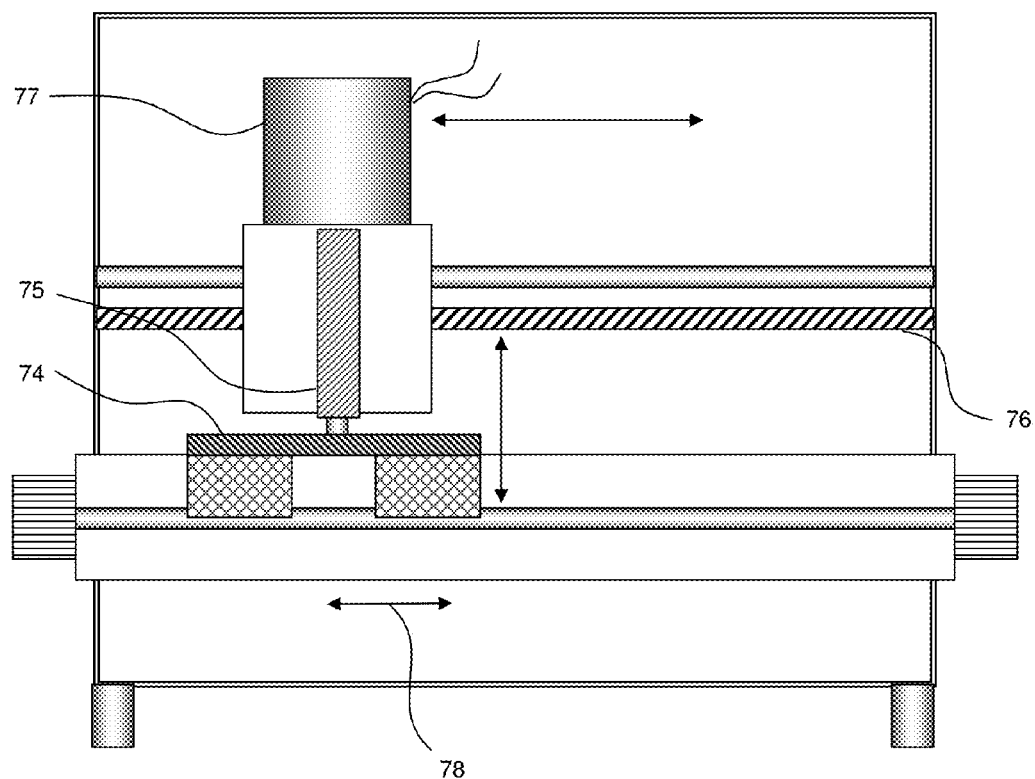
FIGURE 7: Prior art, front view of slide screw tuner with a single vertical axis and double probe

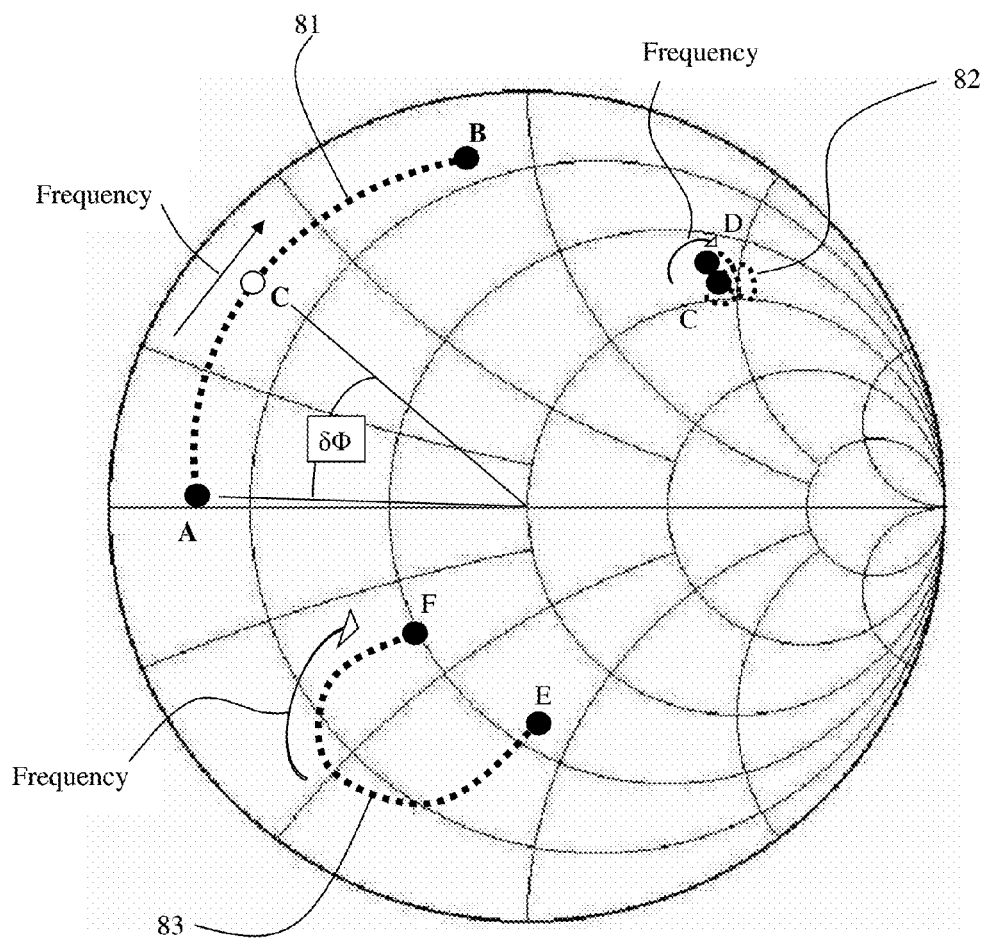
FIGURE 8: prior art: Frequency response of various matching networks

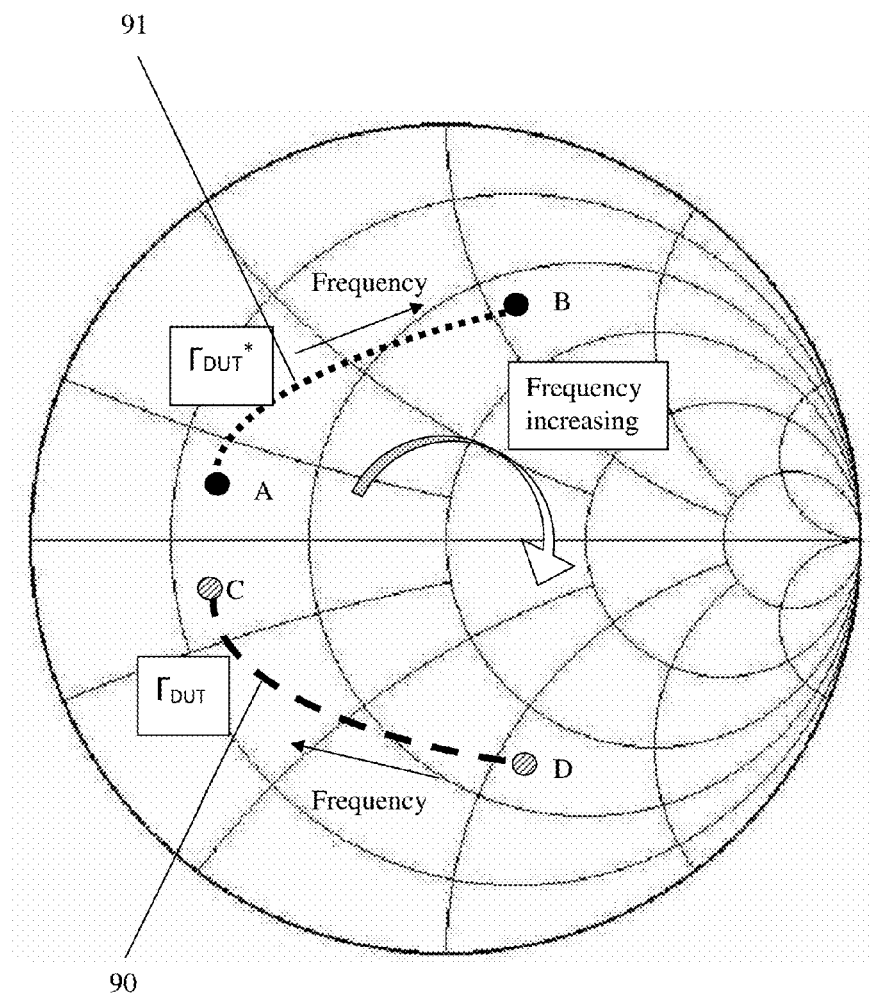
FIGURE 9: prior art: DUT reflection factor and conjugate complex matching network

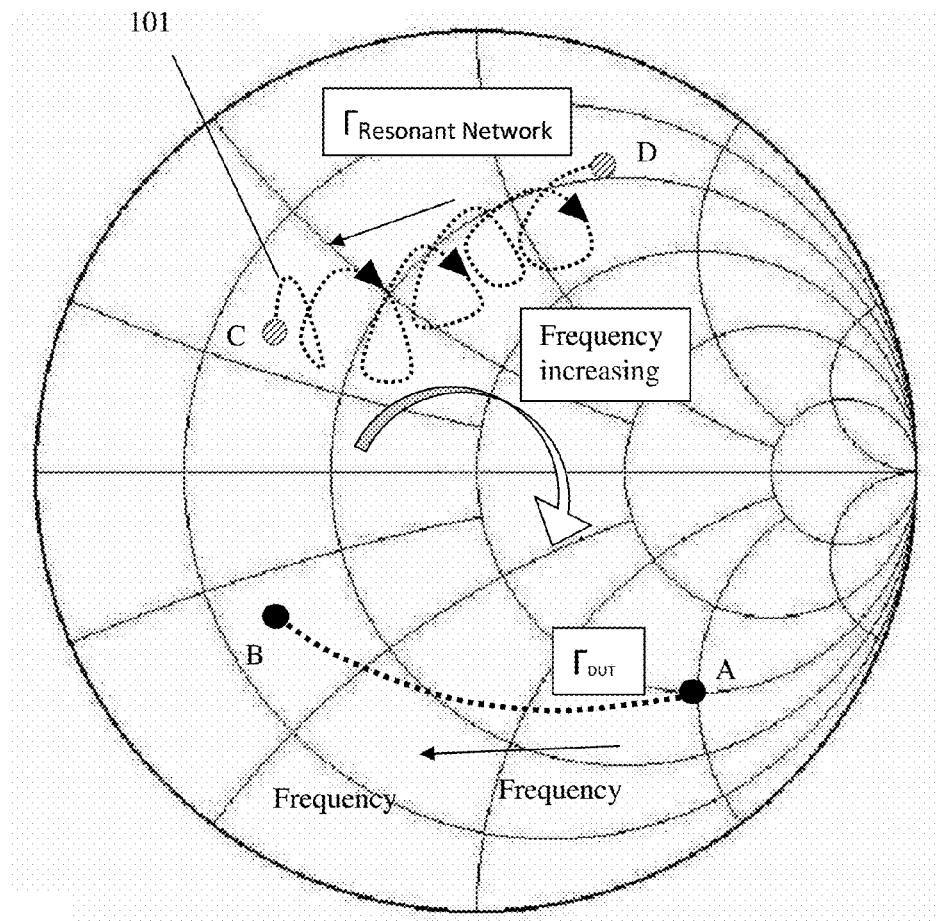
FIGURE 10: DUT matching network using multiple resonances: $Z_C \approx Z_B^*$; $Z_D \approx Z_A^*$

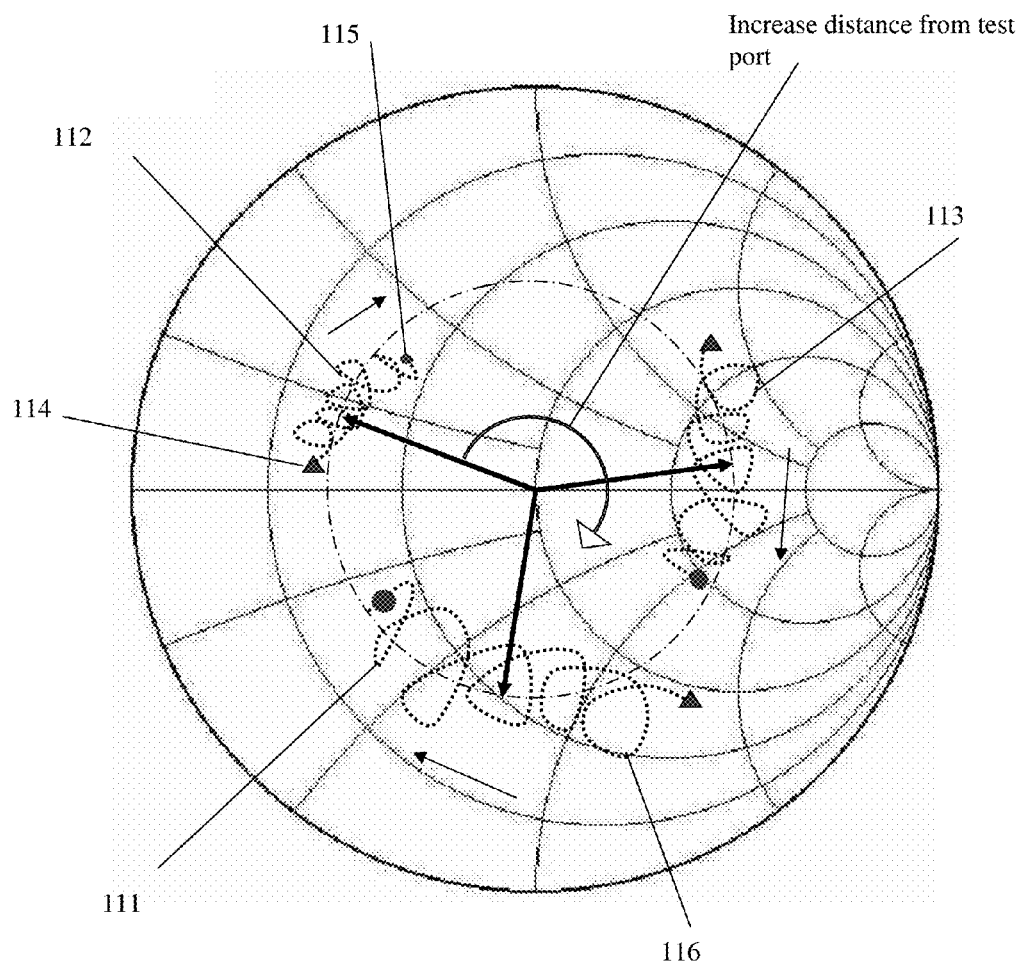
FIGURE 11: Rotation of network response by moving the probe horizontally ( ▲Fmin; ● Fmax )

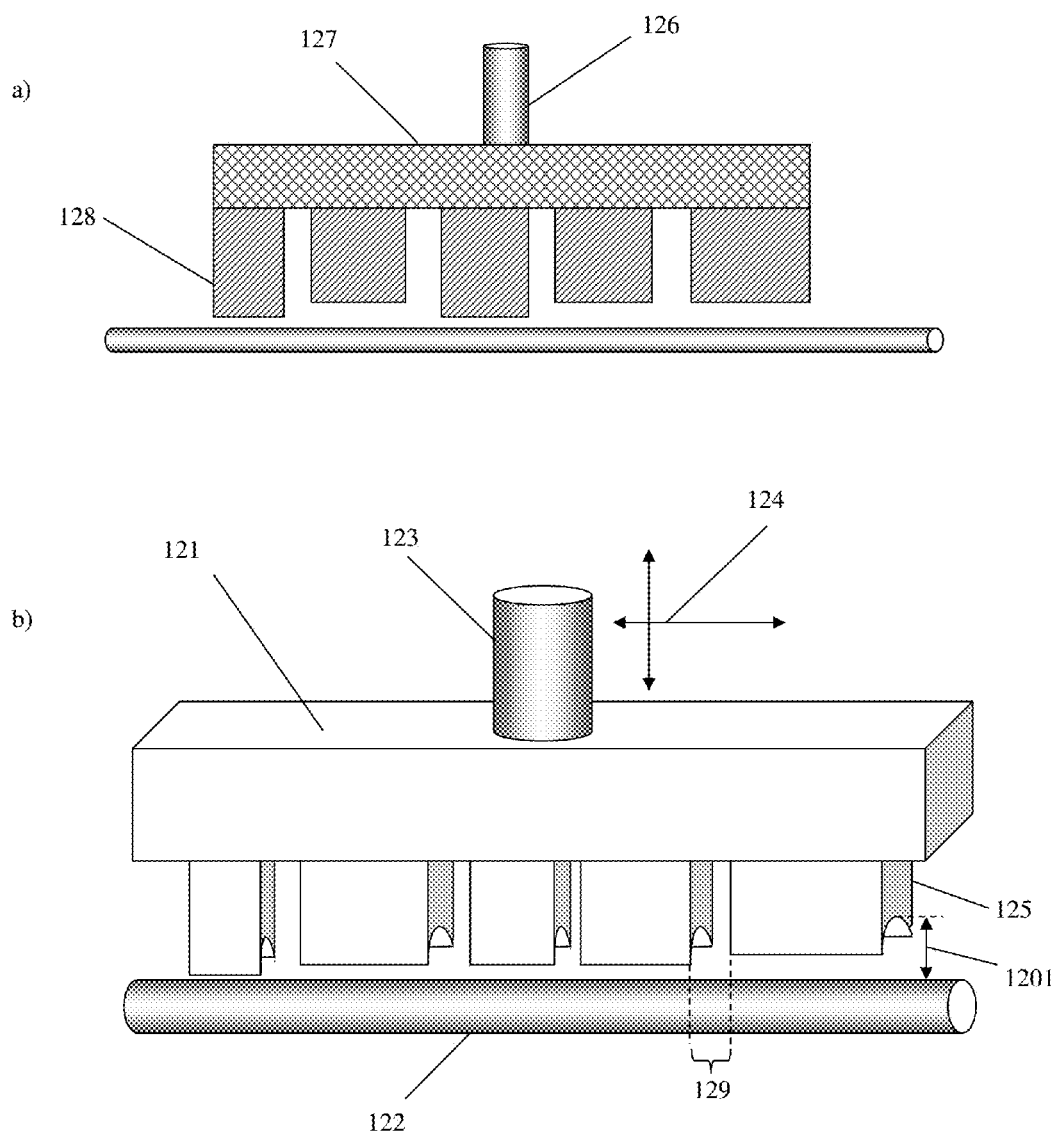
FIGURE 12: Multi-section probe with different coupling per section

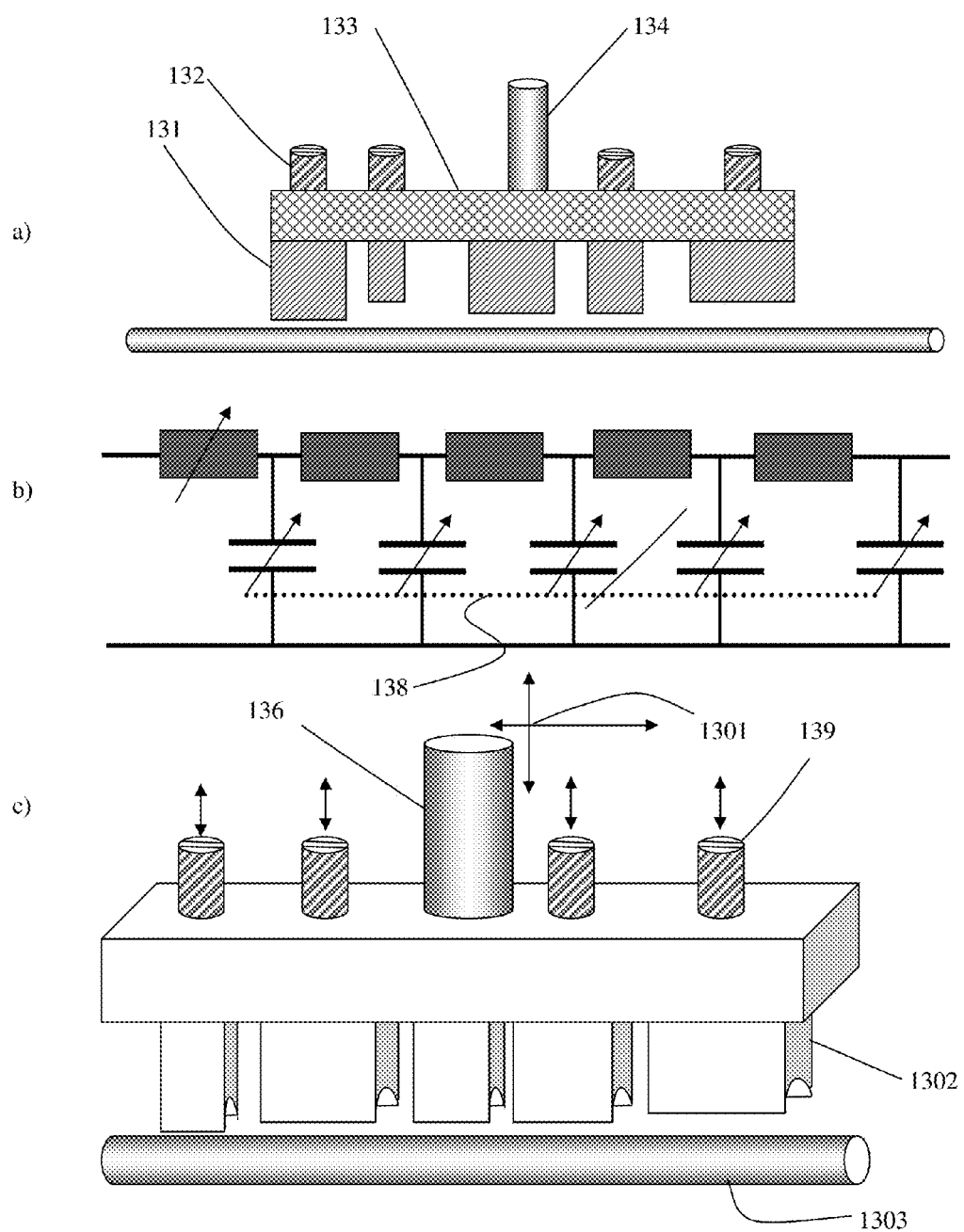
FIGURE 13: Multi-section probe with different adjustable coupling per section

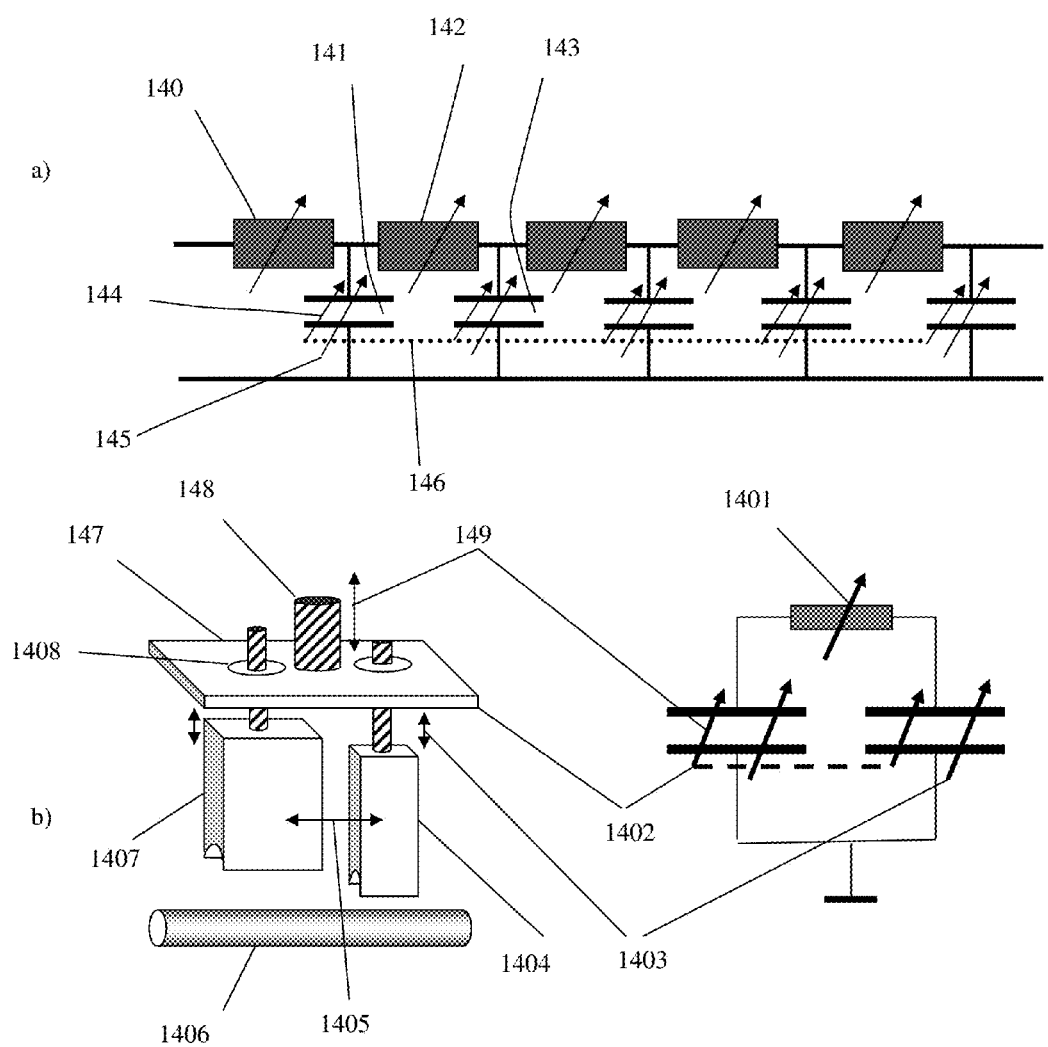
FIGURE 14: 3D view and electrical equivalent of combo-probe with adjustable coupling and phase per section

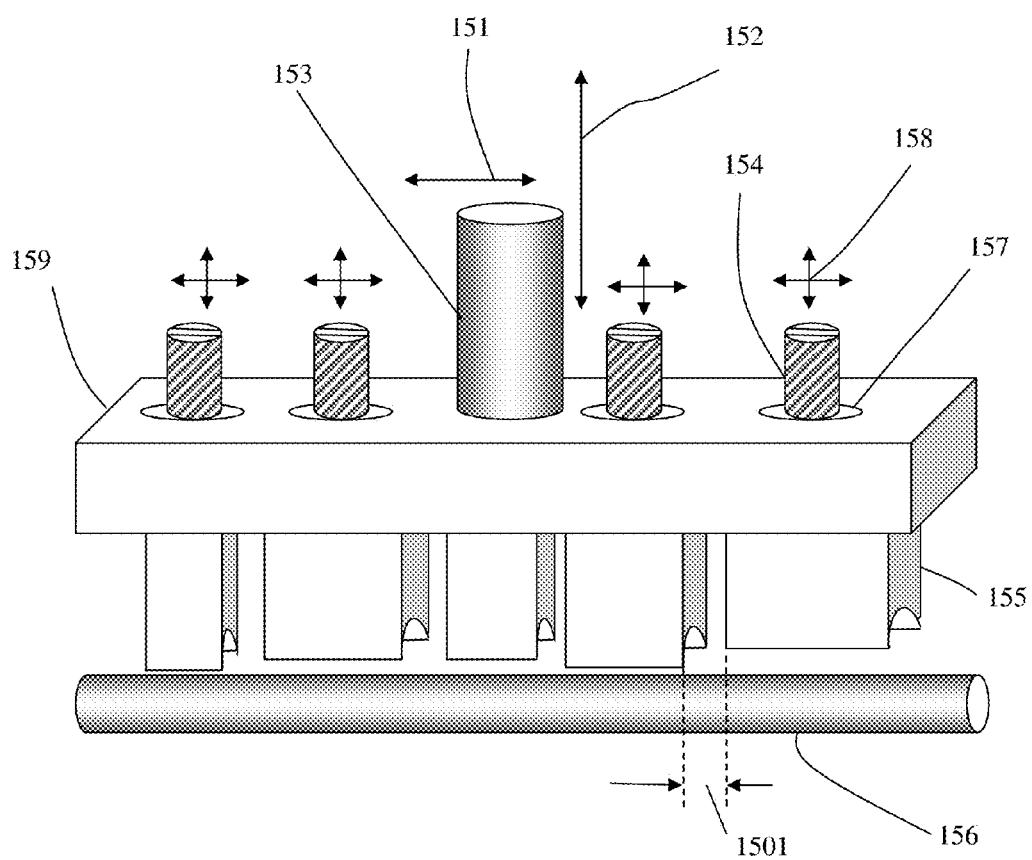
FIGURE 15: Multi-section probe with adjustable coupling and phase per section

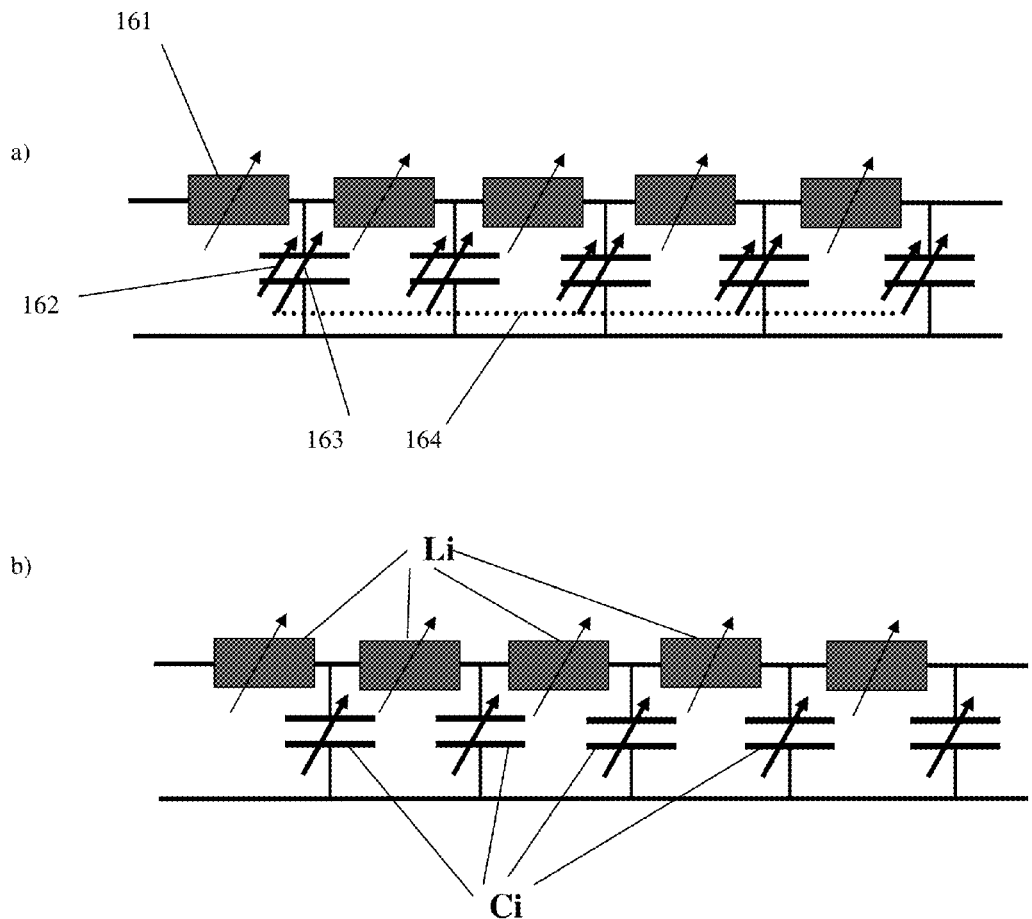
FIGURE 16: a) Electrical equivalent of multi-section probe with adjustable static 162 and dynamic 164 slug coupling and phase; b) electrical model for simulation.

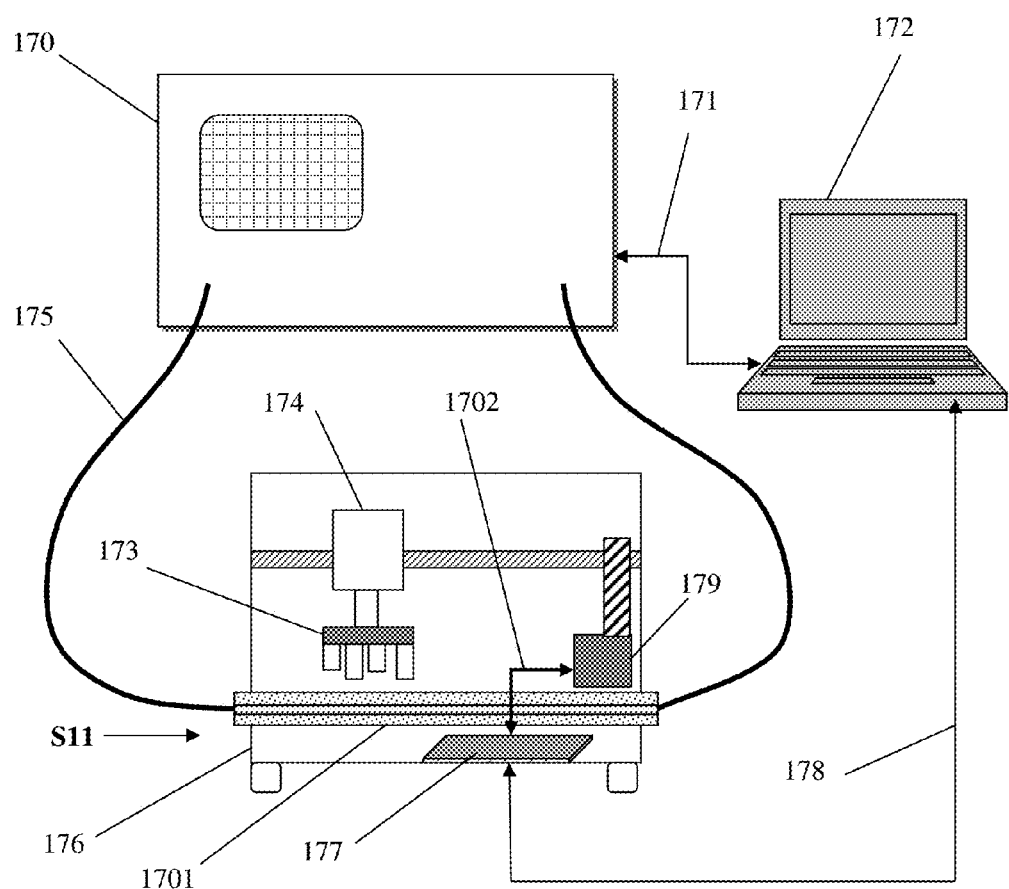
Figure 17: Probe adjustment and tuner calibration setup

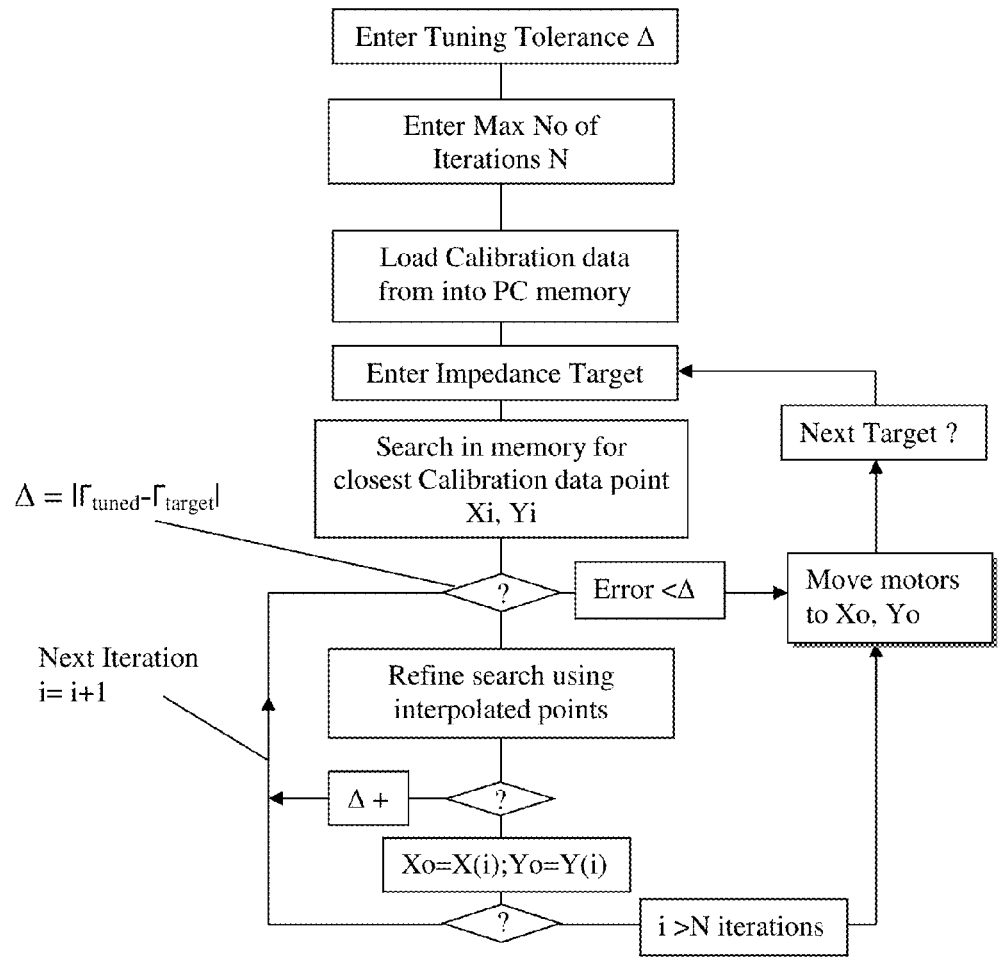
Figure 18: Tuning algorithm

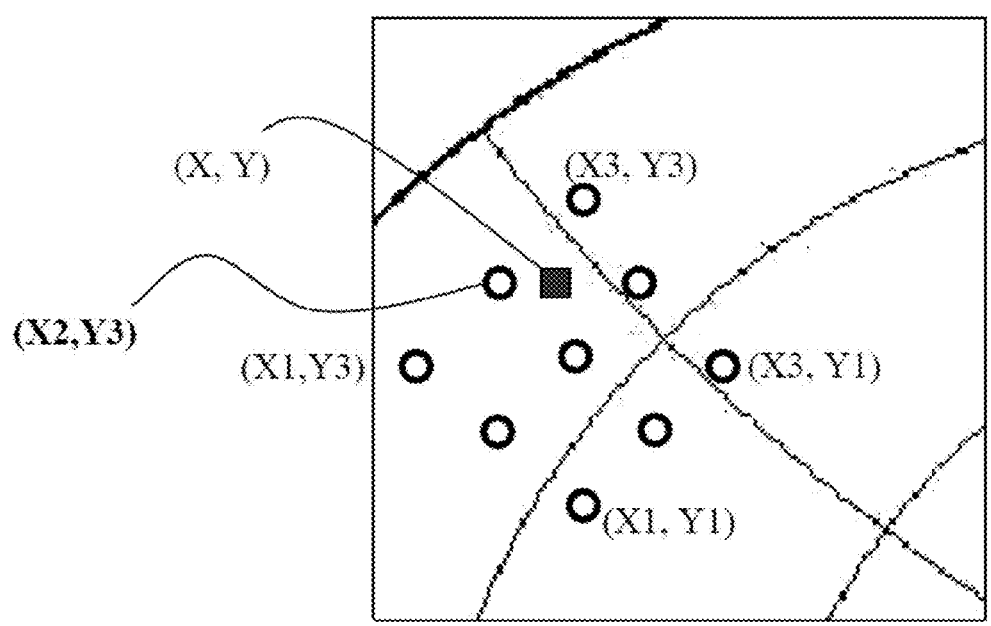
Figure 19: Impedance interpolation scheme for slide screw tuners

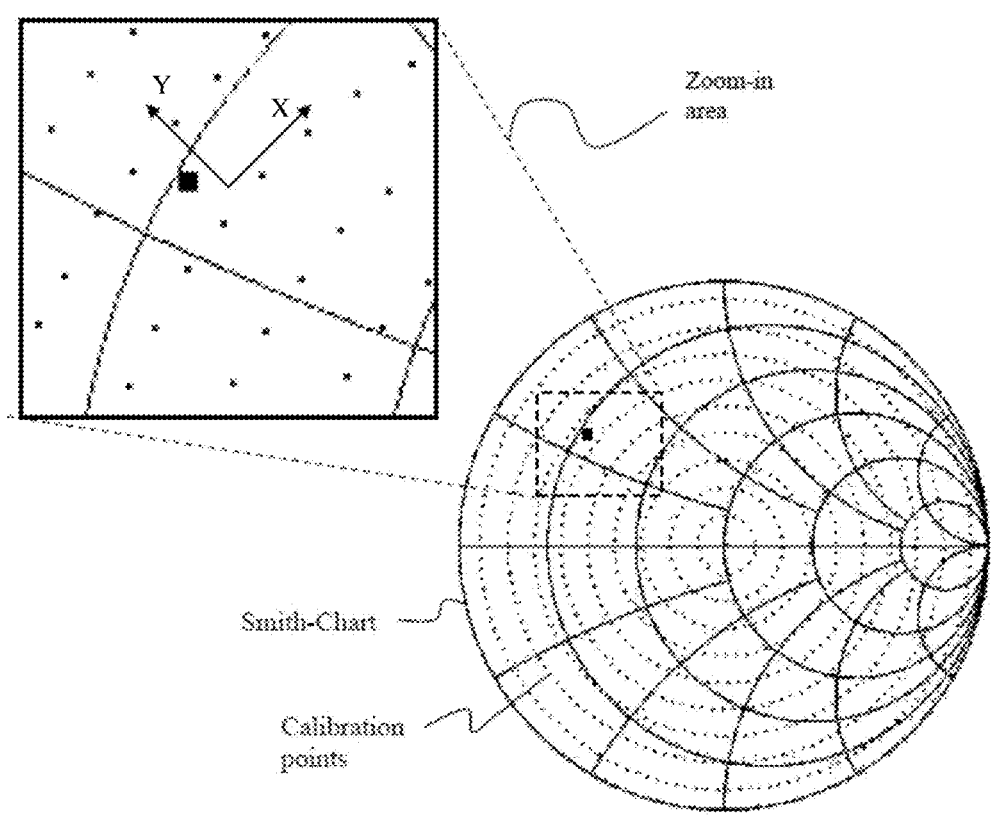
Figure 20: prior art: calibration points of slide screw impedance tuner and detail

WIDEBAND TUNING PROBES FOR IMPEDANCE TUNERS AND METHOD

PRIORITY CLAIM

This application claims priority on provisional application 61/749,575, filed on Jan. 7, 2013, entitled: Wideband tuning probes for impedance tuners and method.

CROSS-REFERENCE TO RELATED ARTICLES

1. U.S. Pat. No. 6,980,064: Slide-screw tuner with single corrugated slug.
2. U.S. Pat. No. 7,053,628: High reflection microwave tuner using metal-dielectric probe and method.
3. LTE Communication (http://en.wikipedia.org/wiki/LT_%28telecommunication%29)
4. U.S. Pat. No. 6,674,293: Adaptable pre-matched tuner system and method.
5. U.S. Pat. No. 6,850,076: Microwave tuners for wideband high reflection applications.
6. Product Note 52, "Prematching tuners for very high VSWR and power load pull measurements"; Focus Microwaves, March 1999.
7. "Three probe tuners tackle multiple tasks", Microwaves & RF Magazine, February 2005, page 90ff.

BACKGROUND OF THE INVENTION AND PRIOR ART

This invention relates to load pull testing of microwave power transistors using automatic microwave tuners for synthesizing reflection factors (or impedances) and match the transistors (device under test, or DUT) at the input and output at the fundamental and harmonic frequencies.

Modern design of high power microwave amplifiers, oscillators and other active components used in various communication systems requires accurate knowledge of the active device's (microwave transistor's) characteristics. In such circuits, it is insufficient and inaccurate for the transistors operating at high power in their highly non-linear regions and close to saturation, to be described using analytical or numerical models only. Instead the devices must be characterized using specialized test setups under the actual operating conditions.

A popular method for testing and characterizing transistors for high power operation is "load pull" and "source pull". Load pull or source pull are measurement techniques employing microwave impedance tuners 2, 4 and other microwave test equipment, like signal sources 1, an RF (Radio Frequency) load 5, control computer 6 and digital connections 7, 8, 9 between the computer and the tuners and test equipment. The microwave tuners 2, 4 in particular are used in order to manipulate the RF impedance conditions under which the DUT 3 is tested (FIG. 1).

Electro-mechanical tuners (see ref. 1) are used in most cases for high power load pull testing, because they have several advantages, such as long-term stability, higher handling of RF power, easier operation and lower cost, compared to other type of tuners such as electronic and active tuners. FIG. 2 shows a front view and cross section of an automatic electro-mechanical tuner using the "slide-screw" tuning concept; a slotted airline (slabline) 215, with two RF connectors 25, 26 at both ends is embedded in a solid housing 216, which also comprises a mobile carriage 28 and means for horizontal drive, typically a lead screw 217; the carriage 28 slides smoothly on polished and grounded shafts 219. The carriage 28 comprises electrically driven 20a stepper motor 20, which is powered by a control computer 6, running appropriate software and controls the movement of a precise vertical axis 21. At the bottom end of the axis 22 an appropriate clamp 22a holds the RF probe 23 and secures its exact and repeatable positioning very close to the center conductor 24 of the slabline 215. Moving the probe 23 closer to the center conductor 24 increases the amplitude of the reflection factor, and moving it along the axis of the slabline 215, at constant distance from the center conductor, controls its phase. The vertical probe control is shown in FIG. 3.

A cross section of the 'slide screw' showing slabline, probe and vertical tuning mechanism is included in FIG. 3; in this configuration adjustable metallic obstacles (probes or "slugs") 30 are inserted into the transmission media of the tuners, which is a slotted coaxial or parallel plate airline (slabline) 31; the capacitive coupling between the vertical probe 30 and the central conductor 32 of the slotted airline (slabline) creates a wideband RF reflection factor ($\Gamma$) for the electromagnetic waves travelling along the slabline, of which the amplitude can be adjusted by inserting (or withdrawing) the probe 30 further into (or from) the slabline and reducing (or increasing) the gap between the probe 30 and the central conductor 32 and therefore increasing (or reducing) the value of the capacitance between the center conductor 32 and the probe 30.

The probe 30 is held and guided by the vertical axis 33 of the tuner and is moved vertically 34 by the axis 33, which is driven by a vertical lead screw and computer controlled stepper motors, known in prior art (FIG. 3 in ref. 2), FIGS. 2, 3.

DETAILED DESCRIPTION OF THE DRAWINGS

The present invention will be better understood in view of the detailed description of the drawings of which:

FIG. 1 depicts prior art: block diagram of a typical automated load pull test setup.

FIG. 2 depicts prior art: front view of automated slide screw tuner with a single vertical axis and probe; Lel is the electrical length between the tuner test port and the RF probe (slug).

FIG. 3 depicts prior art: cross section of capacitive RF probe inserted into a slotted airline (slabline) used in slide screw tuners.

FIG. 4 depicts prior art: front view of automated slide screw tuner with two independent carriages, probes and vertical axes.

FIG. 5 depicts prior art: tuning with two independent probes; first probe creates vector 51, second probe creates vector 52. Stimulus (variable parameter) is frequency, the probes are physically fixed. In arc segment 53 the phase turns positive with frequency (opposite as naturally expected from a passive network).

FIG. 6 depicts prior art: front view of slide screw tuner with two linked and synchronously moving carriages, vertical axes and probes.

FIG. 7 depicts prior art: front view of slide screw tuner with a single vertical axis and double probe (probe with two fixed slugs).

FIG. 8 depicts prior art: Frequency response of various matching networks.

FIG. 9 depicts prior art: DUT reflection factor 90 and conjugate complex load matching network 91.

FIG. 10 depicts prior art: DUT matching network 101 using multiple resonances aiming at matching the DUT at Fmin(A) and Fmax(B): $Z_C \approx Z_B^*$; $Z_D \approx Z_A^*$. $Z^*$ is the conjugate of Z: If Z=R+jX then Z*=R−jX. On the Smith chart this means mirror across the horizontal axis.

FIG. 11 depicts: Change of resonant network response by moving the probe horizontally, away from the test port. The spread increase is obvious.

FIG. 12 depicts: Multi-section probe with different coupling to center conductor per section/slug. Coupling increases inversely to the width of the gap between the concave bottom of the slug and the center conductor (see FIG. 3).

FIG. 13 depicts: Multi-section (combo) probe with different and adjustable coupling per section/slug; a) front view, b) electrical equivalent, c) perspective (3D) view.

FIG. 14 depicts: 3D view and electrical equivalent of combo-probe with adjustable coupling and phase per section. Each element (slug) has an individual static 1403 and a common dynamic 1402 capacitance setting FIG. 15 depicts a perspective view of multi-section (combo) probe with adjustable coupling and phase per section/slug.

FIG. 16 depicts: Electrical equivalent of multi-section probe with adjustable static 162 and dynamic 163, 164 coupling and phase 161 per section/slug.

FIG. 17 depicts a probe adjustment and tuner calibration setup.

FIG. 18 depicts a flowchart of the tuning (impedance synthesis) algorithm.

FIG. 19 depicts an impedance interpolation scheme for slide screw tuners using a set of calibration points; S-parameters at (Xi, Yj)=calibrated points, s-parameters at (X,Y)=interpolated point.

FIG. 20 depicts prior art: calibration points of slide screw impedance tuner and a detailed area of.

DETAILED DESCRIPTION OF THE INVENTION

The term "wideband" must be specifically defined for this application: A "wideband RF component" typically means a component that has a constant or nearly constant characteristic over a wide frequency range; such as a "wideband amplifier" (having constant Gain over a wide frequency band) or a "wideband receiver" (having reception sensitivity over wide frequency band). The term "wideband" of course is relative and depends of the application, the component and state of the art: "a wideband amplifier" used to be one octave (F2/F1=2); it is now up to 5 octaves or more (F2/F1=50). In the case of impedance tuners, to date, "wideband" means a tuner which is capable of creating significant reflection factor ($|\Gamma|>0.85$) over a large frequency range, such as 0.8-18 GHz or 6-40 GHz etc. As will be discussed later, however, this concerns only the amplitude of the reflection factor; instead the phase of the reflection factor changes rapidly. If measurements are carried out at a single frequency this is irrelevant. Recent signal modulation schemes in mobile telephony, however, such as LTE (see ref. 3) require modulation bandwidths up to 100 MHz. In this case the phase change of the reflection factor of impedance tuners is not constant: from the "phase" point of view such tuners shall therefore be considered "narrowband". Therefore "wideband" tuner probes in this sense shall mean probes which create reflection factor with constant phase over a given frequency range, such as 100 MHz.

The reflection factor Gamma: $\Gamma=|\Gamma|*\exp(j\Phi)$ (eq. 1) generated by the capacitive coupling of the probe 30 with the center conductor 32 is presented by the tuner to the DUT and varies with frequency. The phase $\Phi$ of the transmission line between the DUT port and the tuner probe (slug) is $\Phi=-4*\pi*Frequency*Lel$ (eq. 2), whereby Lel is the electrical length between the tuner probe 22a and the tuner test port 25 (FIG. 2); The electrical length Lel is: $Lel=Lphys*sqrt(\in_r)$ (eq. 3), whereby Lphys is the physical length and $\in_r$ ($\geq 1$) is the dielectric constant of the material filling the transmission line ($\in_r$ of air=1). In other words, if Lel or if the frequency change, the phase $\Phi$ of the reflection factor $\Gamma$ changes with the opposite sign.

The change of the impedance generated by the tuner with frequency is important in case the test signal is not "single tone", i.e. if it contains more than one frequency component, as is the case with any "modulated" signal: it means that the impedance generated by the tuner and seen by the DUT changes inside the frequency band of the modulated signal. This creates a systemic measurement uncertainty, since it is unknown under which exact impedance conditions the DUT is being tested. Knowing that any matching network presented to the DUT also has a frequency response (i.e. the impedance presented to the DUT by the matching network changes with frequency as well); one solution is, therefore, to generate, using the tuner, an impedance pattern as a function of frequency over a certain frequency band that fits, as much as possible, the pattern generated by the network needed to match the DUT.

Modern communication signals contain frequency spectra with a bandwidth of up to 100 MHz. In view of equation 2 and for a typical electrical length of Lel=20 cm and assuming using a traditional slide screw type of tuner of FIG. 2, where the amplitude $|\Gamma|$ of the reflection factor remains quasi constant over this type of frequency bandwidth (51 in FIG. 5) this means a change of the phase $\delta\Phi$ (at constant $|\Gamma|$) of the reflection factor (measurement uncertainty) of 48° (following equation 1), corresponding to an arc see segment A to C in FIG. 8. This is not acceptable for such a measurement system. It is obvious, though, that networks other than traditional single probe tuners, can generate response such as 82 and 83, depicted in FIG. 8, with much less phase change $\delta\Phi$ for the same frequency band. Such networks use multiple tuning elements and create local resonances.

In order to avoid this systemic measurement uncertainty the tuning mechanism shall generate controlled impedance over said modulation bandwidth. All physical networks (active and passive devices) create a negative phase turn (clockwise) of the reflection factor on the Smith chart (91, FIG. 9). The associated matching network is the conjugate complex of the active device and must, therefore, create a positive phase turn (90). This is physically impossible using passive networks; the usual technique, to circumvent this natural limitation, is to synthesize passive networks which approach the conjugate complex impedance trace (90) using multiple resonances (101, FIG. 10). In this case the DUT impedance (102) can approximately be conjugate matched by the network (101) over a certain frequency range.

Resonant networks are easily created using inductors and capacitors, but also cascades of capacitive probes in slide screw tuners (FIGS. 4 and 5). In FIG. 5 we see the reflection factor response of a two carriage tuner as in FIG. 4; whereas vector 51 is created by the first probe 42, horizontal movement of the second probe 41 creates a circle 54 centered on a point of the circle 51. The parameter on each of those circles is frequency. It is important to realize that in the arc 53 the phase $\Phi$ as a function of frequency increases, even though it is a passive network. This is due to the resonance created by the cascade of the two probes and is a method used to create matching networks in this invention.

The equivalent to variable inductors and capacitors in case of a microwave slide screw tuner is a cascade of RF probes (slugs) as shown in FIGS. 12, 13 and 15. Each section of airline 129 acts as an inductor and the coupling between each probe and the center conductor as a capacitor. The distance 129 between probes can be variable and also the distance between the probes and the center conductor 1201. This makes both inductors and capacitors variable. It is therefore possible to find positions of the individual probes relative to each-other and at various distances from the center conductor (corresponding to various capacitances) to generate a required frequency response of the reflection factor. This can be done experimentally or numerically.

Depending on the frequency band of the specific design the frequency response of the synthesized matching network can have various forms (FIG. 8). It may either conjugate-match the reflection factor of the DUT 81, 83 or it may regroup all frequency points in a small area 82. It all comes down to frequency, choice of the nature, number and interconnection of the specific matching elements of the network and, of course, their feasibility.

A typical configuration is shown in FIG. 14(*a*). It shows a cascade of variable inductors and capacitors, which can be optimized to generate a frequency response, inside a specific frequency band such as 101 in FIG. 10. The variable capacitors 143 are created by the capacitive coupling of the probes 1407 to the center conductor 1406. Each section of the multi-probe 1407, 1404 is statically adjusted at different distance 1403 from said center conductor 1406. When the whole probe assembly 147 moves vertically 149 the capacitance associated with all segments varies simultaneously 1402. Therefore we have a combination of a static adjustment 145 and a dynamic adjustment 144; the dynamic adjustment 144, 149 is controlled by the vertical axis 148 via the probe holder 146, 147. The dynamic adjustment 144, 149, 1402 applies to all probe-segments and is controlled by the vertical axis 148. The static adjustment 145, 1403 is a parameter which is adjusted experimentally on a VNA (FIG. 17). The adjustability of the inductors 1401, 140, 142 is obtained by adjusting the distance 1405 through shifting and securing each probe section relative to each-other inside the slots 1408.

A multi-section probe as in FIG. 15 is the preferred embodiment. It allows each individual probe (slug) to be positioned and secured relative to each-other 158 using screws 154, adjusting the overall reflection factor response on a calibrated vector network analyzer. Once the individual slugs 155 are positioned vertically, they can be moved horizontally inside a lengthy holes 157 changing the distance between slugs which corresponds to changing the inductance between capacitors (slugs) 1501. By moving the multi-segment probe horizontally 151 relative to the test port of the tuner 25 (FIG. 2) the response at the tuner test port changes: from 112 to 113 and to 116, as shown in FIG. 11. Within certain limits also the amplitude of the reflection factor can be adjusted without affecting the overall frequency response, by controlling the vertical position 152 of the multi-segment probe relative to the center conductor 156. However it should be assumed that the optimum configuration is valid mostly close to one radius of the reflection factor, but on a whole circle on the Smith chart (FIG. 11). FIG. 11 shows an example of three arbitrary angles at which the networks can be rotated by simply moving the multi-section probe assembly away from the tuner test port (FIG. 2).

The manual probe configuration is a process using a VNA and the tuner connected to it. The VNA is configured for displaying the reflection factor S11 at the tuner test port over the whole frequency band of the modulated signal (typically 50 to 200 MHz) around the center frequency of operation, which varies, typically, between 600 MHz and 6 GHz. In a first step, and given a target impedance pattern, the probe is inserted in the slabline until a reflection factor amplitude close to the expected value is reached. Then the probe is moved to generate a reflection factor corresponding roughly to the same phase as the target. Subsequently the slugs are moved horizontally and vertically within the probe assembly trying to match the targeted frequency response. When the best compromise has been reached the tuner carriage is moved closer to the test port of the tuner. This will reduce the spread of the S11 response. If this is still within the target expectations no slug change is undertaken. If not the slugs are re-arranged slightly to improve the fitting to the target. Then the tuner carriage is moved away from the test port. This will spread the S11 response. If the spread is unacceptable the slugs are re-arranged slightly trying to better fit to the target response. The procedure is repeated until a satisfactory agreement between probe response and target pattern is reached. Then all slugs are fastened and the tuner can be calibrated and used for tuning and load pull operations around the target area.

Numerically a multi-section probe can be designed by using electrical equivalent circuits (models) of transmission lines 161 and capacitors 162, 163 using a scheme as in FIG. 16. The newly used symbol of a variable capacitor with two arrows indicates that, each slug can be statically (manually) adjusted relative to the center conductor distance and secured, then the assembly of several slugs can be adjusted dynamically (remotely) vertically using the common vertical axis. Probes can be simulated by capacitors to a large extent. A numerical simulation of the network of FIG. 16 will, rapidly, indicate the feasibility of the required network response and the required number and size of the individual probes by changing the values of the transmission line length 161 and the capacitors 162, 163. The search uses the difference as an error function: DIFF, defined as the sum of the vector differences between the target S11 response of the matching network and what results from the network in FIG. 16.

DIFF=SUM $|S11 \cdot c(f) - S11 \cdot t(f)|^2$ (eq. 11), whereby SUM is, typically, the sum of the squares of the vector differences at all used frequency points in the operation frequency (F) band Fmin≤F≤Fmax; S11·c(f) is the calculated response and S11·t (f) the target value of the reflection factor for every combination of capacitor Ci and transmission line length Li, whereby Ci is the capacitor of the slug at section "i" and Li is the transmission line length between the sections "i" and "i+1", i=1, 2, 3 etc. When the minimum value of DIFF is found the associated Li and Ci are saved (see electrical equivalent in FIG. 16*b*). The optimization boundaries are limited by the actual feasibility of the multi-section probe (maximum length and capacitance). Then the Li and Ci values are converted in approximate slug positions depths (distances from the center conductor) and the multi-section probe can be assembled. It is reasonable to assume, that uncertainties in the simulations will require that the individual probes be "statically" slightly adjustable horizontally and vertically 158 around the calculated starting positions. This can be done by attaching the probes to vertical screws 154 and inserting each screw into a slot 157 in the holding bar 159. Final adjustment and securing each probe will then be done, as before, on a calibrated vector network analyzer 170 using a setup as in FIG. 17, in view of the desired reflection factor response pattern over the given frequency range.

FIG. 11 is a presentation of the frequency response of the reflection factor of a multi-section probe at various horizontal positions of the probe. When the probe moves away from the reference plane this is equivalent to adding a section of transmission line between the probe and the DUT. The initial response 112 is rotating 113, 111 but it also spreads. This is because the phase of the lowest frequency point 114 rotates slower than the highest frequency point 115, as can be seen from equation 2. To compensate for this phenomenon the initially adjusted probe configuration may be such that the phase slope at the DUT reference plane is slightly positive to allow for a negative slope with an average of approximately zero over the frequency band and the probe horizontal movement.

The tuner 176 is calibrated using a vector network analyzer (VNA, 170), FIG. 17. The tuner is controlled via digital communication 178 by the control PC 172 via a data bus 178 and a digital interface 177 which controls the motor 179 positions through the control cable 1702. A similar motor is mounted on carriage 174 and controls the vertical position of the probe assembly 173. The tuner 176 is connected using high quality RF cables 175 to the VNA 170. The motors 179 set the horizontal position of the carriage 174 and the vertical position of the probe 173 relative to the center conductor of the slabline 1701. The data measured by the VNA 170 are collected by the control PC 172 via a digital communication cable 171 using a standard protocol (USB, GPIB, LAN etc.). The VNA is calibrated at a number of preselected frequencies Fo to F1 in the range of the intended operation. The calibration data are saved in a format comprising the tuner s-parameters and the associated probe positions (X: horizontal, Y: vertical). Each probe position (X,Y) defines a tuner state.

Tuning in this document is defined as the process of synthesizing requested impedances at a certain frequency. This is slightly different than ordinary used when "tuning" a radio: tuning a radio means obtaining best reception of a radio transmitter. In our case it simply means generating a certain, user defined impedance, also in the absence of receiving a transmitter signal. This can only be done if the tuner has been calibrated beforehand. A non-calibrated tuner is useless for a targeted impedance synthesis (or "tuning"). "Tuning" is here not understood as a manual "trial-and-error" technique, in which the tuner is set to a state, then measured, then re-set and re-measured, until the desired impedance value is reached. This is an asymptotic and useless method for "tuning" in order to test a DUT. Tuner calibration and proper use of the data allows the "trial-and-error" process to be done extremely rapidly in computer memory. The "trial-and-error" process can be either random or, better, based on a gradient optimization. A random process will generate values for randomly chosen probe positions, whereas a gradient process will start at a point close to the target and proceed by changing the probe position by an amount proportional to the distance to the target. The algorithm for this process is illustrated in the flowchart of FIG. 18.

The tuning procedure uses calibrated points as well as interpolated points. The calibration data by themselves do not suffice for accurate and detailed measurements. The number of calibration points is limited by the duration of the calibration process. If the total number of tuner states, which is on the order of a few millions, would be calibrated, then the calibration routine would last several days or weeks. This is impractical and unacceptable. The slide screw tuner offers much higher resolution than 1,000 or 5,000 calibration points allow, which can be collected in reasonable time (10 to 30 minutes per frequency point). Therefore an interpolation is needed to allow synthesizing the requested impedance with enough precision, even if the impedance point is not part of the calibration.

The interpolation algorithm comprises two steps; given a target reflection factor (=impedance), in a first step a fast numeric search among all fixed calibration points allows to identify a grid of the 9 calibrated points closest to and surrounding the target impedance (X1,Y1) to (X3,Y3) (FIGS. 19, 20); in a second step and using the probe's horizontal (X) and vertical (Y) coordinates inside the slabline, a numerical, second order, interpolation algorithm is employed in order to calculate the s-parameters of the tuner two-port at any specific RF probe position with great accuracy; this is possible because the selected interpolation formulas describe accurately the natural behavior of the tuners, with its smooth and continuous dependence of s-parameters from horizontal and vertical positions of the RF probe.

The s-parameters of the tuner are calculated using the following interpolation formula: Sij(X,Y)=A(Y)*Sij(Xk,Y1)+B(Y)*Sij(Xk,Y2)+C*Sij(Xk,Y3), where k={1, 2, 3} (eq. 4). The coefficients A, B, C are calculated using the following relations (equations 5 to 10):

$$A(X)=(X-X2)*(X-X3)/((X1-X2)*(X1-X3));$$ (eq. 5)

$$B(X)=(X-X1)*(X-X3)/((X2-X1)*(X2-X3));$$ (eq. 6)

$$C(X)=(X-X2)*(X-X1)/((X3-X2)*(X3-X1));$$ (eq. 7)

$$A(Y)=(Y-Y2)*(Y-Y3)/((Y1-Y2)*(Y1-Y3));$$ (eq. 8)

$$B(Y)=(Y-Y1)*(Y-Y3)/((Y2-Y1)*(Y2-Y3));$$ (eq. 9)

$$C(Y)=(Y-Y2)*(Y-Y1)/((Y3-Y2)*(Y3-Y1));$$ (eq. 10)

whereby X and Y are the physical horizontal and vertical positions of the multi-section RF probe inside the slabline. These formulas allow calculating the s-parameters of the tuner using 3 sets of 3 points (Xi,j–Yi,j) with {i,j}={1, 2, 3}, surrounding the requested position X,Y. The 3 sets of points are: set 1: (X1,Y1), (X1,Y2), (X1,Y3); set 2: (X2,Y1), (X2,Y2), (X2,Y3); set 3: (X3,Y1), (X3,Y2), (X3,Y3) as shown in FIG. 19. The choice is adequate because a horizontal only movement of the RF probe changes the phase and a vertical only movement mostly the amplitude of the reflection factor (FIG. 20).

The impedance synthesis algorithm (tuning) comprises a number of logical steps, all aiming at minimizing the vector difference between the target impedance, which is defined by the operator of the system, either by manual entry or through a pattern impedance file generated automatically or through a script file; without limiting the scope of the search, since a number of steps can be implemented in different order to obtain the same result, those steps are:

a) retrieve calibration data from disc into computer memory (for faster access), b) enter maximum number of iterations N (or use a default number), c) enter error tolerance Delta (or use a default value), d) enter target reflection factor Gamma_Target, e) search for the probe positions corresponding to the smallest difference DIFF between the calibration data point Gamma and Gamma_Target, whereby DIFF=|Gamma_Target−Gamma(X,Y)|, whereby Gamma is a vector having a real part and an imaginary part, and the parts signifying that the alternative voltage and current waves are not in phase: Gamma=Real(Gamma)+j*Imag(Gamma), f) compare the difference DIFF with Delta; if DIFF<Delta then adopt the actual X,Y positions as a solution and move the motors to the calibration point and continue to the next impedance point (step d), g) set the iteration counter I=0; this counter will stop the search if the search does not find a solution within a given number of iterations;

h) change the probe positions, X,Y by at least one step in either horizontal or vertical direction and interpolate the reflection factor using a number of the closest calibration points and calculate the actual difference to the target;

i) increase the iteration counter I by 1, j) if DIFF<Delta then adopt the actual X,Y positions as a solution and move the motors to the latest positions and continue to the next impedance point (step d), k) if the iteration counter is exceeds N, then compromise by adopting the actual X,Y positions as a solution, move the motors and continue with step d), l) move to step d) for a new target impedance point.

The above search algorithm is "static": this means the change (step) in probe coordinates is constant: DeltaX=constant; DeltaY=constant; it can be set different for X and Y but will not change during the search.

The search can use also a "gradient" or "differential" approach, in which the steps in probe positions are changed by an amount which is proportional to the size of DIFF; since the reflection factors are always <1, it is obvious that DIFF will be a number smaller than 1. Since typical tolerance Delta is of the order of 0.005, the number of correction steps in the gradient search should be corrected by experimental factors KX and KY to better mirror the sensitivity of the reflection factor to horizontal (X) and vertical (Y) movements of the probes. In typical search algorithms KX and KY depend on the nature of the data. In our case with DIFF having values between 0.05 and 0.005, and the change in Gamma being more sensitive in Y than in X, KX shall have typical values between 20 and 200 and KY values around 10. These correction factors depend on the specific hardware configuration (probe shape and size) and are to be optimized experimentally case by case. They will generate probe position correction of enough steps to create a significant correction when DIFF is too high.

In order to ensure a termination of the search, a maximum number of iterations (N) is defined; typical values of N, for this type of tuner, are of the order of 100 to 200; if after this number of iterations a minimum of the difference between target and actual (in memory) value is not found, the search stops and exits. In all cases the probe positions (Xo, Yo) found to create the best agreement (smallest DIFF) between tuned and target Gamma are transferred to the tuner interface and the motors are set or saved in a pattern file.

Although the present invention has been explained hereinabove by way of a number of preferred embodiments, it should be pointed out that alternatives of the described components and methods are possible and, as far as obvious to a person skilled in the art, they shall not limit the scope of the present invention.

What I claim as my invention is:

1. Adjustable multi-section RF probe assemblies for programmable electro-mechanical RF slide screw impedance tuners;

said tuners comprising a slabline, at least one mobile carriage with a vertical axis holding a plurality of RF probes forming tuning assemblies, which are insertable into the slabline;

said slabline having lateral grounded walls and center conductor;

each said probe assembly comprising a probe body, a handle and a multitude of metallic slugs (capacitive probes);

whereby the handle is firmly attached to said vertical axis, and whereby each said slug of the probe assembly is adjustable individually at various horizontal distance from the other slugs and at various height (distance from the center conductor) of said slabline;

whereby said adjustment of the slugs creates arbitrary reflection factor pattern over a certain frequency band.

2. A numerical search procedure determines the values of the elements of networks representing multi-section probe assemblies as in claim 1, to fit best to a target S11 response over a specific frequency band, whereby the response of said probe assemblies is calculated using RF network simulation software and an electrical model comprising a cascade of variable transmission lines and variable shunt capacitors;

and whereby each individual line and capacitor is modified in a search routine until a best agreement (least square vector difference) between the calculated and the required S11 frequency response over said frequency band is reached;

and whereby the values of said transmission lines and capacitors are saved.

3. An impedance synthesis algorithm (tuning) for impedance tuners as in claim 1 comprising the following steps:

a) enter maximum number of iterations N, b) enter error tolerance Delta, c) load tuner calibration data (s-parameters) into computer memory, d) enter target reflection factor Gamma-Target, e) search for the probe coordinates (X, Y) of calibration data points corresponding to the smallest vector difference DIFF between the S11(X, Y) and Gamma-Target, f) if the DIFF is smaller than Delta move the motors to X, Y and proceed to step d), g) else set the iteration counter i to 0, h) calculate DIFF as the least square vector difference between the reflection factor S11 at the actual probe coordinates and Gamma-Target, i) change the probe coordinates by at least one step in horizontal and/or vertical direction to X', Y' and interpolate the reflection factor S11(X', Y') using a number of the closest calibration points and calculate the actual vector difference to the target, j) increase the iteration counter i by 1, k) if DIFF is smaller than Delta move the motors to the latest coordinates X', Y' and proceed to step d), l) else if the iteration counter is larger than N move to step d), m) else proceed to step h) using the latest probe coordinates as starting point.

4. An impedance synthesis algorithm (tuning) for impedance tuners as in claim 1 comprising the following steps:

a) enter maximum number of iterations N, b) enter error tolerance Delta, c) load tuner calibration data (s-parameters) into computer memory, d) enter target reflection factor Gamma-Target, e) search for the probe coordinates (X, Y) of calibration data points corresponding to the smallest vector difference DIFF between S11(X, Y) and Gamma-Target, f) if the difference DIFF is smaller than Delta move the motors to X, Y and proceed to step d), g) else, set the iteration counter i to 0, h) calculate DIFF as the least square vector difference between the reflection factor S11 at the actual probe coordinates and Gamma-Target, i) change the probe coordinates by a number of steps to DX, DY proportional to the difference |DIFF| in horizontal and/or vertical direction and interpolate the reflection factor S11(X+DX, Y+DY) using a number of the closest calibration points and calculate the actual difference to the target, j) increase the iteration counter i by 1, k) if DIFF is smaller than Delta move the motors to the latest probe coordinates and proceed to step d), l) else, if the iteration counter is larger than N proceed to step d), m) else proceed to step h) using the latest probe coordinates as starting point, the manual search terminates when the requested pattern is approximately matched over the whole frequency band and over the horizontal carriage travel, and the slugs are secured within the probe assembly.

5. Impedance tuners as in claim 1 comprising a test port and an idle port, a slotted airline (slabline) between those ports and at least one mobile carriage sliding horizontally along the axis of said slabline;

each said carriage being remotely controlled horizontally, and whereby each said carriage comprises at least one, remotely controlled, vertical axis holding said RF probe assembly, said probe assembly being insertable vertically inside the slot and capacitively coupled to the center conductor and movable horizontally along the axis of said slabline.

6. An iterative manual adjustment procedure for impedance tuners as in claim 5, whereby said tuner is connected to a pre-calibrated vector network analyzer (VNA), which is tuned to the operation frequency band, and the reflection factor (S11) at the tuner test port is observed over the entire operational frequency band (FIG. 8);

whereby individual slugs of said multi-section probe assembly are adjusted manually and alternatively in horizontal and vertical position relative to the other slugs, and whereby said adjustment yields the closest possible response to the required S11 over the said frequency band;

and whereby said slugs are secured in the determined position.

7. An experimental method for synthesizing requested arbitrary impedance (reflection factor) patterns over a broad frequency range uses impedance tuners as in claim 5, whereby said tuner is connected to a pre-calibrated vector network analyzer (VNA) which is tuned to the operation frequency band, and whereby said multi-section tuner probe is inserted into the slabline until the amplitude of the requested reflection factor at the tuner test port is reached, and whereby said probe is placed at an initial horizontal position corresponding to the target impedance at the center frequency;

and each slug of said multi-section probe is adjusted manually horizontally and vertically alternatively, to approach the requested reflection factor (impedance) pattern, and whereby the tuner carriage is moved on both sides of the initial position, between a position closer to the test port and a position further away from the test port, and whereby said slugs are re-adjusted alternatively to reduce the pattern spread of the reflection factor, and fastened.

8. Impedance tuners as in claim 5, whereby said carriages are positioned using electrical stepper motors and gear, the whole being operationally connected to a control processor (controller) through an electronic interface.

9. Impedance tuners as in claim 8, whereby said controller runs appropriate calibration and impedance synthesis software, said software residing in a data processor inside the tuner housing.

10. Impedance tuners as in claim 8, whereby said controller runs appropriate calibration and impedance synthesis software, said software residing in a data processor on an external control computer.

\* \* \* \* \*